US009923109B2

(12) United States Patent
Matalon

(10) Patent No.: US 9,923,109 B2
(45) Date of Patent: Mar. 20, 2018

(54) SELF-POWERED LIGHT-SEEKING APPARATUS AND PHOTOVOLTAIC CELLS WITH LIGHT CONCENTRATING MEANS

(76) Inventor: Yair Matalon, Tel-Aviv (IL)

(*) Notice: Subject to any disclaimer, the term of this patent is extended or adjusted under 35 U.S.C. 154(b) by 702 days.

(21) Appl. No.: 14/381,595

(22) PCT Filed: Feb. 29, 2012

(86) PCT No.: PCT/IB2012/050943
§ 371 (c)(1),
(2), (4) Date: Aug. 28, 2014

(87) PCT Pub. No.: WO2013/128236
PCT Pub. Date: Sep. 6, 2013

(65) Prior Publication Data
US 2015/0040964 A1   Feb. 12, 2015

(51) Int. Cl.
*H01L 31/00* (2006.01)
*H01L 31/042* (2014.01)
*G01S 3/786* (2006.01)
*H01L 31/052* (2014.01)
*H02S 20/00* (2014.01)
(Continued)

(52) U.S. Cl.
CPC ............ *H01L 31/0422* (2013.01); *F24J 2/38* (2013.01); *F24J 2/5413* (2013.01); *F24J 2/5427* (2013.01); *G01S 3/7861* (2013.01); *H01L 31/0521* (2013.01); *H01L 31/0547* (2014.12); *H02S 20/00* (2013.01); *H02S 20/32* (2014.12); *H02S 40/00* (2013.01); *H02S 40/22* (2014.12); *F24J 2/16* (2013.01); *Y02E 10/47* (2013.01); *Y02E 10/52* (2013.01)

(58) Field of Classification Search
CPC ..... H01L 31/0422; H02S 40/00; H02S 20/00; H02S 20/32
See application file for complete search history.

(56) References Cited

U.S. PATENT DOCUMENTS 4,225,781 A   9/1980   Hammons
4,556,788 A   12/1985   Hanak
(Continued)

FOREIGN PATENT DOCUMENTS

GB           2365116       2/2002
WO     WO 2009/045141    4/2009

*Primary Examiner* — Matthew T Martin
(74) *Attorney, Agent, or Firm* — Alphapatent Associates, Ltd; Daniel J. Swirsky

(57) ABSTRACT

A self-powered light seeking apparatus and method for directing a target-plane towards a light source. The apparatus includes a photovoltaic powering arrangement configured to convert light energy into a driving current to power an actuator. The actuator is coupled to a support platform and is wired to the photovoltaic powering arrangement such that the polarity of the driving current causes the actuator to drive the target-plane towards alignment with the light source. A solar energy collection system including a photoelectric assembly for generating electricity from light incident upon an active area; a light concentrator comprising a substantially planar reflective surface subtending an angle to the active area such that light arriving along a line perpendicular to the active area and striking the reflective surface is reflected onto the active area; and a cooling unit configured to maintain the photoelectric assembly at an efficient operating temperature.

13 Claims, 14 Drawing Sheets

(51) Int. Cl.

| | |
|---|---|
| *H01L 31/054* | (2014.01) |
| *H02S 40/00* | (2014.01) |
| *F24J 2/38* | (2014.01) |
| *F24J 2/54* | (2006.01) |
| *H02S 20/32* | (2014.01) |
| *H02S 40/22* | (2014.01) |
| *F24J 2/16* | (2006.01) |

(56) References Cited

U.S. PATENT DOCUMENTS

| | | | |
|---|---|---|---|
| 5,228,924 | A | 7/1993 | Barker et al. |
| 5,317,145 | A | 5/1994 | Corio |
| 6,089,224 | A | 7/2000 | Poulek |
| 7,339,108 | B2 | 3/2008 | Tur et al. |
| 7,340,899 | B1 | 3/2008 | Rubak et al. |
| 7,388,146 | B2 | 6/2008 | Fraas et al. |
| 7,884,308 | B1 * | 2/2011 | Mejia .................. F24J 2/38 126/576 |
| 2006/0174930 | A1 | 8/2006 | Murphy et al. |
| 2008/0017784 | A1 * | 1/2008 | Hoot .................. G01S 3/7861 250/203.4 |
| 2009/0114211 | A1 * | 5/2009 | Homyk .................. F24J 2/085 126/578 |
| 2011/0100429 | A1 * | 5/2011 | Mughal .................. F24J 2/085 136/246 |

* cited by examiner

US 9,923,109 B2

SELF-POWERED LIGHT-SEEKING APPARATUS AND PHOTOVOLTAIC CELLS WITH LIGHT CONCENTRATING MEANS

CROSS-REFERENCE TO RELATED APPLICATIONS

This application is a U.S. National Phase Application under 35 U.S.C. 371 of International Application No. PCT/IB2012/050943, which has an international filing date of Feb. 29, 2012.

FIELD OF THE INVENTION

The embodiments disclosed herein relate to self-powered alignment systems, in particular, to apparatus for maintaining alignment of a mounted body to a moving light source. The embodiments disclosed herein further relate to solar concentration systems. In particular, the embodiments refer to apparatus for increasing the efficiency and output of photovoltaic panels in a simple and cost-effective manner.

BACKGROUND

In certain situations, such as the use of a solar panel, it is desirable to maintain equipment at a particular angle relative to a light source, such as the sun. In the specific case of a solar panel, such apparatus may be used to increase the solar energy received by the panel for the length of the day, from when the sun rises in the east until it sets in the west. The prior art has addressed this issue, including solutions making use of actuators following either a specific algorithm from a data processing unit, or acting upon information from light sensors processed by a data processing unit. These actuators require an external power source to supply the motive force for the actuators. Using known solutions, the essentially mechanical operation is controlled by complicated and possibly fragile and expensive computing units. Moreover, the prior art systems require possibly vulnerable connections to external power sources.

For example, U.S. Pat. No. 5,317,145 to Corio, titled, "Radiation Source Detector And Tracker Control having a Shade Pole and Radiation Responsive Surface in the Shape of Narrow Bands" describes a tracker controller system in which a pair of photo-resistive cadmium sulfide sensors mounted in the shadow of a shade pole generate a voltage signal proportional to their resistive values which signal is delivered to a comparator circuit that causes a tracker driver to operate when the voltage signal falls outside of a voltage window established by the comparator circuit.

It will be noted that Corio's system uses resistive cadmium sulfide sensors to detect light. These sensors are resistive elements which do not produce any power. Indeed Corio's system requires an external power supply to power its drivers.

U.S. Pat. No. 4,225,781 to Hammons, titled, "Solar Tracking Apparatus" describes an invention that relates to a solar tracking device which tracks the position of the sun using paired, partially-shaded photocells. Auxiliary photocells are used for initial acquisition of the sun and for the suppression of false tracking when the sun is obscured by the clouds.

It will be noted that although Hammons's system uses photocells, these are used as light sensors to detect the direction of the light source and are not of a size suitable to power the electric motors used for alignment. Again, an external power supply is required for Hammon's system to operate.

It will be appreciated that solar energy is often harvested in environments where external energy sources are unavailable. There is therefore a need for a system that accurately can move an apparatus to maintain a specific optimum angle relative to the sun without the use of microprocessors or external power sources. The embodiments disclosed herein address this need.

Further, in cases where the solar panel comprises photovoltaic cells for the production of electricity from solar power, a large portion of the cost of the system is dependent on the surface area of the active area covered by the photovoltaic cells. In general, when discussing such systems, reference is made to their efficiency in terms of cost-per-watt. Reducing the amount of photovoltaic cell material while maintaining the same wattage output is desirable. The prior art has addressed this issue and various solar concentrating methods have been devised, including those using lenses and parabolic or other curved mirrors to concentrate solar energy. Using known solutions, the solar energy may be concentrated, but the concentrating mechanisms themselves can become prohibitively expensive.

In addition, although greater solar energy concentrated on a smaller photvoltaic panel will provide greater photovoltaic output, much heat is lost in the concentrated solar flux and as a byproduct of the photovoltaic conversion. Furthermore, the heating of the photovoltaic cells will itself lead to a loss of efficiency as the photovoltaic cell material heats beyond its most efficient operating temperature. This may also lead to permanent degradation of the photovoltaic cell material itself over time.

It will be appreciated that there is therefore a need for a cost-effective system that can concentrate solar radiation onto photovoltaic cells and also cool such cells when the concentrated power overheats them. The embodiments disclosed herein address this need.

SUMMARY

According to a first aspect of the disclosure, a self-powered alignment system is presented. It is one aspect of the current disclosure to present a self-powered light-seeking apparatus comprising at least one actuator configured to direct a target-plane towards a light source; and at least one photovoltaic powering arrangement configured to convert light energy into a driving current to power the at least one actuator; wherein the driving current has a polarity such that the actuator drives the target-plane towards alignment with the light source.

Optionally, the at least one actuator is configured to drive the target-plane in a first direction when a positive potential difference is applied between its anode and its cathode and to drive the target-plane in a second direction when a negative potential difference is applied between its anode and its cathode.

Variously, the at least one actuator may comprise a piston. Alternatively or additionally, the at least one actuator may comprise an electric motor.

Optionally, the photovoltaic powering arrangement comprises: a first photovoltaic panel configured at a first angle to the target-plane and comprising at least one photovoltaic cell connected to an anode and a cathode such that the magnitude of potential difference between its anode and its cathode is dependent upon angle of light incident upon the photovoltaic panel; and a second photovoltaic panel configured at a second angle to the target-plane and comprising at least one photovoltaic cell connected to an anode and a cathode such that the magnitude of potential difference between its anode and its cathode is dependent upon angle of light incident upon the photovoltaic panel.

According to some embodiments, the anode of the first photovoltaic panel and the cathode of the second photovoltaic panel may be connected to an anode of the actuator, and the cathode of the first photovoltaic panel and the anode of the second photovoltaic panel may be connected to the cathode of the actuator.

Optionally, the first angle is equal and opposite to the second angle. For example, the first angle may be approximately equal to forty-five degrees to the target-plane and the first angle may be approximately equal to minus forty-five degrees to the target-plane.

In selected embodiments, the first photovoltaic panel and the second photovoltaic panel may be configured such that they do not shade one another.

Where appropriate, the photovoltaic powering arrangement may further comprise: a third photovoltaic panel configured at a third angle to the target-plane and comprising at least one photovoltaic cell connected to an anode and a cathode such that the magnitude of potential difference between its anode and its cathode is dependent upon angle of light incident upon the photovoltaic panel; and a fourth photovoltaic panel configured at a fourth angle to the target-plane and comprising at least one photovoltaic cell connected to an anode and a cathode such that the magnitude of potential difference between its anode and its cathode is dependent upon angle of light incident upon the photovoltaic panel. Optionally, the anode of the third photovoltaic panel and the cathode of the fourth photovoltaic panel are connected to an anode of at least a second actuator, and the cathode of the third photovoltaic panel and the anode of the fourth photovoltaic panel are connected to the cathode of the second actuator.

According to further embodiments, the apparatus may comprise a first actuator configured to rotate the target plane about a first axis and connected to a first photovoltaic power arrangement. Additionally, the apparatus may further comprise a second actuator configured to rotate the target plane about a second axis and connected to a second photovoltaic power arrangement. Optionally, the first actuator comprises an azimuth actuator configured to drive the target-plane about a polar axis. Optionally, the second actuator comprises an elevation actuator configured to drive the target-plane about a declination axis.

According to various embodiments, the apparatus comprise a solar panel mounted to a framework and configured to track the daily and seasonal movement of the sun across the sky. Additionally or alternatively, the apparatus may comprise a altazimuth support platform. Accordingly the apparatus may comprise a telescope.

It is a further aspect of the disclosure to teach a method for aligning a target-plane towards a light source comprising:
  providing at least one actuator;
  mounting a first photovoltaic panel to a support platform such that it is orientated at a first angle to the target-plane;
  mounting a second photovoltaic panel to the support platform that it is orientated at a second angle to the target-plane;
  connecting the photovoltaic panels to at least one actuator;
  the photovoltaic panels powering at least one actuator to drive the support platform such that light intensity upon the first photovoltaic panel equals light intensity upon the second photovoltaic panel.

According to a second aspect, the disclosure presents a device for aligning towards a bright light source comprising: a support platform rotatable about at least one axis; an actuator operable to rotate the support platform about the axis, the actuator having an anode and a cathode; and an independent power supply for powering the actuator. The power supply may comprise a first solar panel comprising at least one solar cell connected to an anode and a cathode such that the magnitude of potential difference between the anode and the cathode is dependent upon angle of light incident upon the solar panel; a second solar panel comprising at least one solar cell connected to an anode and a cathode such that the magnitude of potential difference between the anode and the cathode is dependent upon angle of light incident upon the solar panel. Accordingly, the anode of the first solar panel and the cathode of the second solar panel are connected to the anode of the actuator, and the cathode of the first solar panel and the anode of the second solar panel may be connected to the cathode of the actuator such that the actuator is powered directly by the solar panels with a polarity dependent upon angle of light incident upon each solar panel.

According to a second aspect of the disclosure, a solar energy collection system is presented. The solar energy collection system may comprise: at least one photoelectric assembly for generating electricity from light incident upon at least one active area; at least one light concentrator comprising at least one substantially planar reflective surface subtending an angle to the active area such that light arriving along a line perpendicular to the active area and striking the reflective surface is reflected onto the active area; and at least one cooling unit configured to maintain the photoelectric assembly at an efficient operating temperature. Optionally, at least two the reflective surfaces are mounted upon wings to at least two sides of the active area.

According to some embodiments, the photoelectric assembly comprises a plurality of active areas arranged into strips. Optionally, the light concentrator comprises a plurality of pairs of the wings flanking each of the strips. Such a light concentrator may be configured to collect light over an area larger than the active area by a factor between 1.5 and 3. In particular, the light concentrator may be configured to collect light over a catchment area larger than the active area by a factor of two. Accordingly, the substantially planar reflective surface may subtend an angle of 60 degrees to the active area.

Where appropriate, the photoelectric assembly comprises an array of photovoltaic cells. Optionally, the heat exchanger is configured to maintain the photovoltaic cells at an efficient operating temperature. Accordingly, the cooling unit may comprise at least one heat exchanger adjacent to the photoelectric assembly.

Such a heat exchanger may be in fluid communication with a fluid heating system. According to some embodiments, the heat exchanger comprises at least one pipe for transporting a coolant to and from the photoelectric assembly. Optionally, the coolant comprises water.

In some embodiments, the heat exchanger comprises at least one fluid carrying pipe in thermal contact with the photoelectric assembly; and a heat trap encompassing the at least one pipe.

According to particular embodiments, the solar energy collection system further comprises a tracking mechanism operable to align the photovoltaic assembly and the solar concentrator towards incoming light. In certain embodiments, the tracking mechanism is the self-powered light-seeking apparatus of the first aspect of the invention or the device for aligning towards a bright light of the second aspect of the invention.

BRIEF DESCRIPTION OF THE FIGURES

For a better understanding of the embodiments and to show how it may be carried into effect, reference will now be made, purely by way of example, to the accompanying drawings.

With specific reference now to the drawings in detail, it is stressed that the particulars shown are by way of example and for purposes of illustrative discussion of selected embodiments only, and are presented in the cause of providing what is believed to be the most useful and readily understood description of the principles and conceptual aspects. In this regard, no attempt is made to show structural details in more detail than is necessary for a fundamental understanding; the description taken with the drawings making apparent to those skilled in the art how the several selected embodiments may be put into practice. In the accompanying drawings.

DETAILED DESCRIPTION

Alignment System

Figure 1:
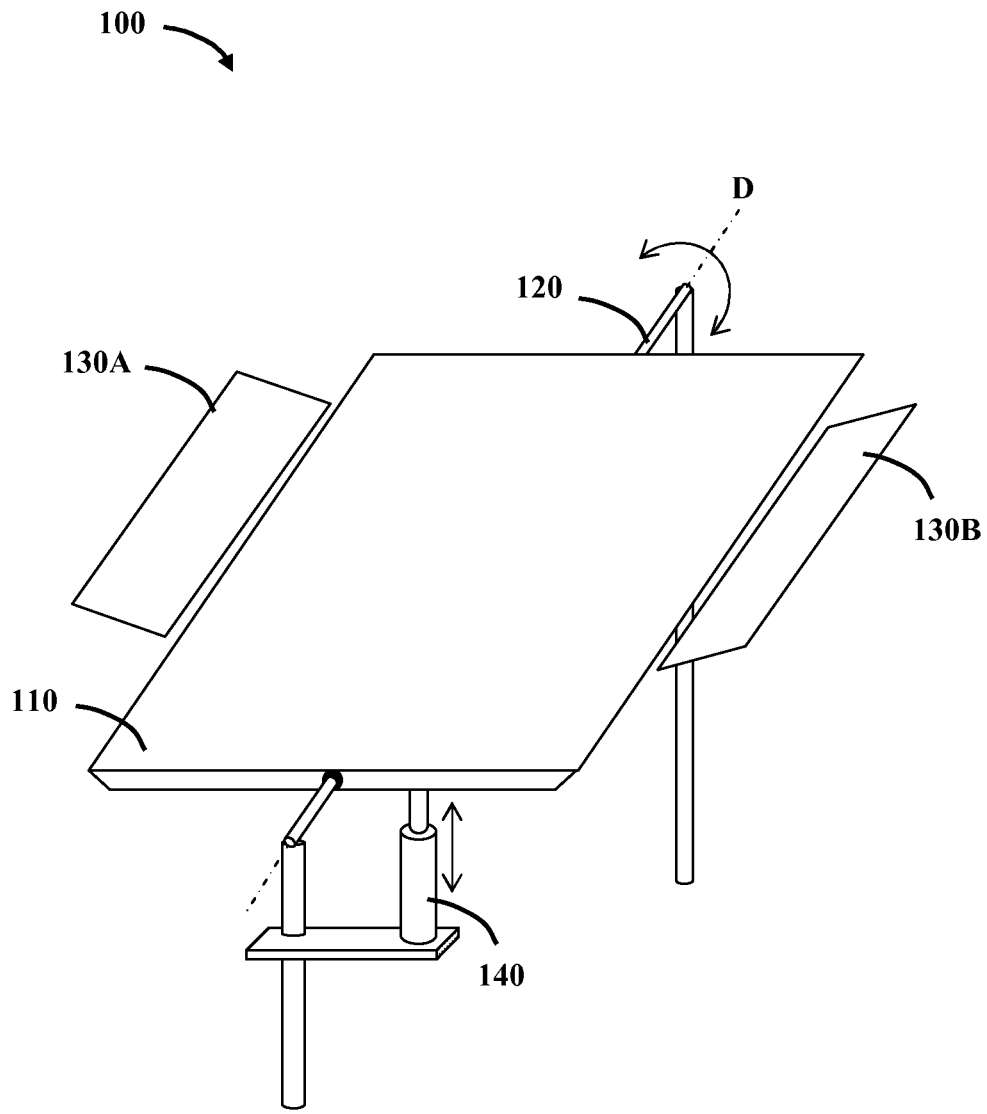
FIG. 1 is a schematic representation of a first embodiment of a self-powered light seeking apparatus with a support platform on a single axis able to rotate east-west, side photovoltaic panels are shown as is the actuator and its connection to the support platform.

Reference is now made to FIG. 1 illustrating a first embodiment of a self-powered light seeking apparatus 100 configured and operable to track a light source such as the sun. The self-powered light seeking apparatus 100 includes a support platform 110, an axis 120, two photovoltaic panels 130A, 130B and an actuator 140.

The support platform 110 may be used for supporting equipment such that its position relative to a target plane is maintained. For example, the support platform 110 may be an altazimuth mount or other platform used to support a solar panel, telescope, other sun-monitoring equipment or the like. It is noted that the self-powered light seeking apparatus 100 may be configured to adjust the position of the support platform 110 such that the target plane is aligned towards a light source (e.g. aligned orthogonally to the direction of the incident sunlight).

In a particular embodiment wherein the support platform is used to support a solar panel, it will be appreciated that the greatest intensity of solar energy can be collected by a collector aligned orthogonally to the direction of the incident sunlight. Accordingly, a solar panel, photovoltaic cells, solar heat exchanger, solar concentrator, a focusing system or the like may be mounted to the support platform 110 such that it remains parallel to the target plane. Consequently, as the support platform 110 tracks the apparent solar movement across the sky during the course of a day, the panel may be able to collect more of the available solar energy and with greater efficiency.

The support platform 110 may be configured to rotate about at least one axis 120. For example, where a polar axis 120 is provided parallel to a North-South meridian D, the support platform 110 may be rotatable in an East-West direction throughout the day.

As the sun appears to move across the sky during the day, the incident solar rays originate from different parts of the sky. In the morning solar rays arrive from the eastern sky moving steadily westward throughout the day. As outlined hereinbelow, although this is not the only component of apparent solar movement, it is by far the largest component of the sun's diurnal movement.

The actuator 140 may be coupled to the support platform 110 and operable to generate torque, thereby rotating the support platform 110 about the axis 120 such that equipment mounted thereupon may be directed towards the light source. Variously, an azimuth actuator 140 may be provided to rotate the support platform 110 about a polar axis 120. Alternatively or additionally, an elevation actuator may be provided to rotate the support platform about a declination axis.

Some possible actuators that may be powered by electrical power include rotary electrical motors, solenoids, pistons, DC actuators and the like. In some cases the mechanical force produced by the actuator is rotary in nature and in some cases it is linear, but there are numerous known methods for converting the force into the necessary torque for moving the support platform 110 about the axis 120.

In contradistinction to prior art tracking systems which draw power from external power supplies such as generators, power cells or mains lines, it is a particular feature of the self-powered light seeking apparatus 100 that the actuator 140 receives motive power from the two photovoltaic panels 130A, 130B The two photovoltaic panels 130A, 130B are arranged to either side of the axis 120, for example to the east and the west of the axis 120. Each photovoltaic panels 130A, 130B is operable to generate a potential difference when light is incident upon its active area 132. The magnitude of the potential difference generated may depend upon the intensity of the light incident upon the active area 132.

The photovoltaic panels 130A, 130B are provided to supply power to the actuator 140. Accordingly the panels 130A, 130B may be conductively connected to an anode and a cathode associated with the actuator 140, such that mechanical force is produced on the application of potential difference across the anode and the cathode.

It will be appreciated that an actuator 140, which may be configured to operate with direct-current (DC), may produce mechanical force in opposing directions depending on the electrical polarity of the potential difference across the anode and cathode. Consequently, when the polarity of the potential difference changes, the direction of torque applied to the support platform 110 will also change. Optionally, the system is configured such that as the light source is out of the alignment with the support platform 110, the torque produced by the actuator 140 may tend to move the support platform 110 closer to optimal alignment to the light source. In this way the system may provide negative feedback to track the sun through the day.

Figure 2:
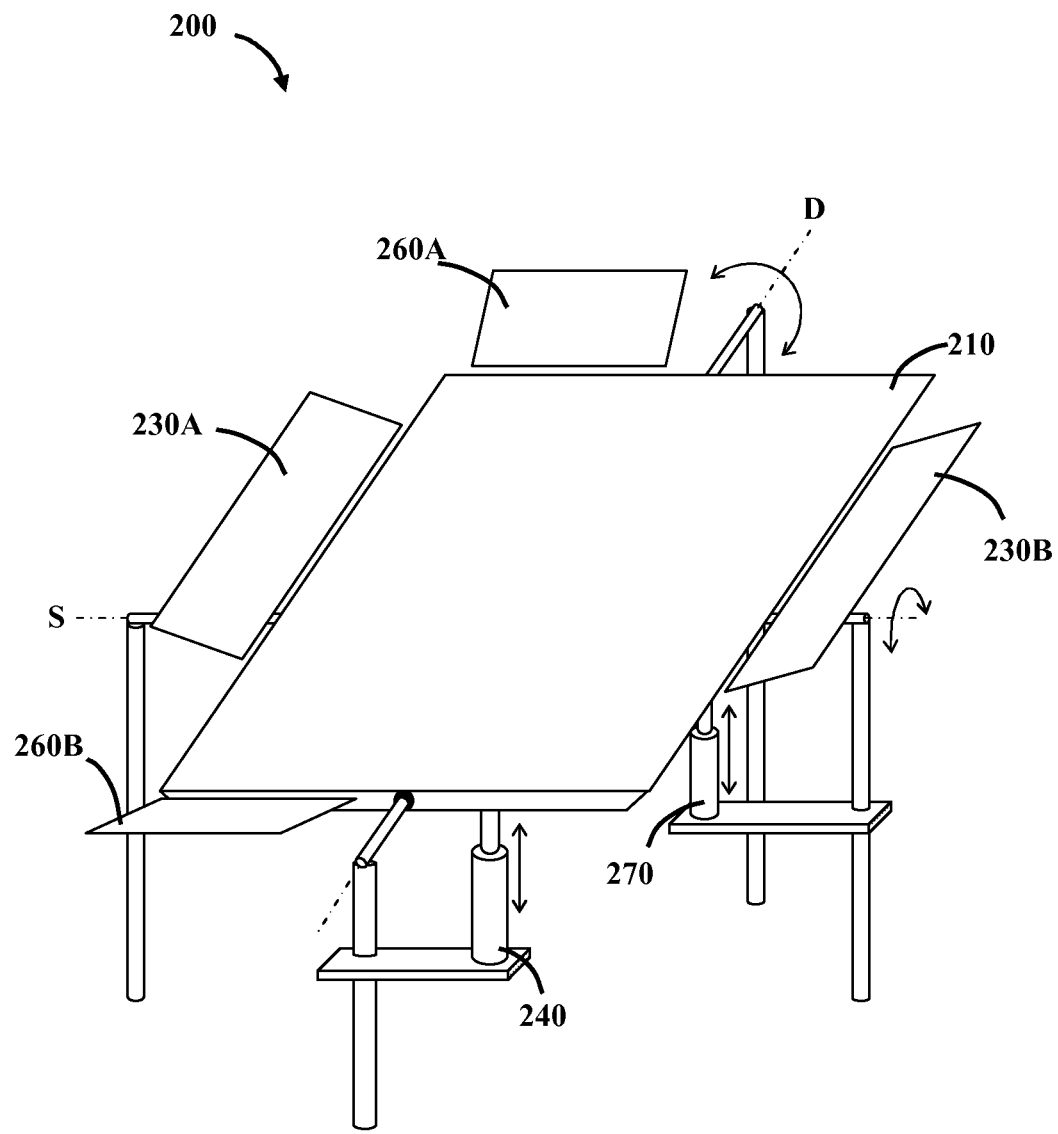
FIG. 2 is a schematic representation of a second embodiment of a self-powered light seeking apparatus which also has a second axis for rotating north south, additional photovoltaic panels on the north and south sides and a second actuator.

Referring now to FIG. 2 a second embodiment of a self-powered light seeking apparatus 200 is represented. The self-powered light seeking apparatus 200 of the second embodiment may include a support platform 210, a first axis 220, a first pair of two photovoltaic panels 230A, 230B and a first actuator 240. It will be noted that the second embodiment of the self-powered light seeking apparatus 200 further includes a second axis 250, a second pair of two photovoltaic panels 260A, 260B and a second actuator 270.

The second axis 250 may be at right angles to the first axis 220. For example a first axis 220 may be a polar axis parallel to the North-South meridian D and the second axis 250 may be a declination axis S aligned approximately East-West, thereby enabling the support platform to pivot in a north-south fashion.

The second actuator 270, for example an elevation actuator, may be mechanically connected to the support platform or axis 250 enabling it to rotate the support platform 210 about the second axis 250.

The second pair of two photovoltaic panels 260A, 260B may be provided upon opposing sides of the second axis 250, for example to the north and south of the support platform 210. The second pair of panels 260A, 260B are electrically connected to the second electrical actuator 270.

It will be appreciated that due to the earth's axial tilt, seasonal changes can be observed in the apparent position of the sun in the sky. The elevation of the sun depends on both the latitude of the location and the specific date in the year. Using a biaxial system such as that described herein in relation to the second embodiment of the self-powered light seeking apparatus 200, the sun may be tracked not only in its diurnal east-west path, but also through its seasonal north-south variations.

It is particularly noted that unlike tracking systems of the prior art, systems described herein do not require computational elements to perform complicated calculations involving times and latitudinal data.

Figure 3:
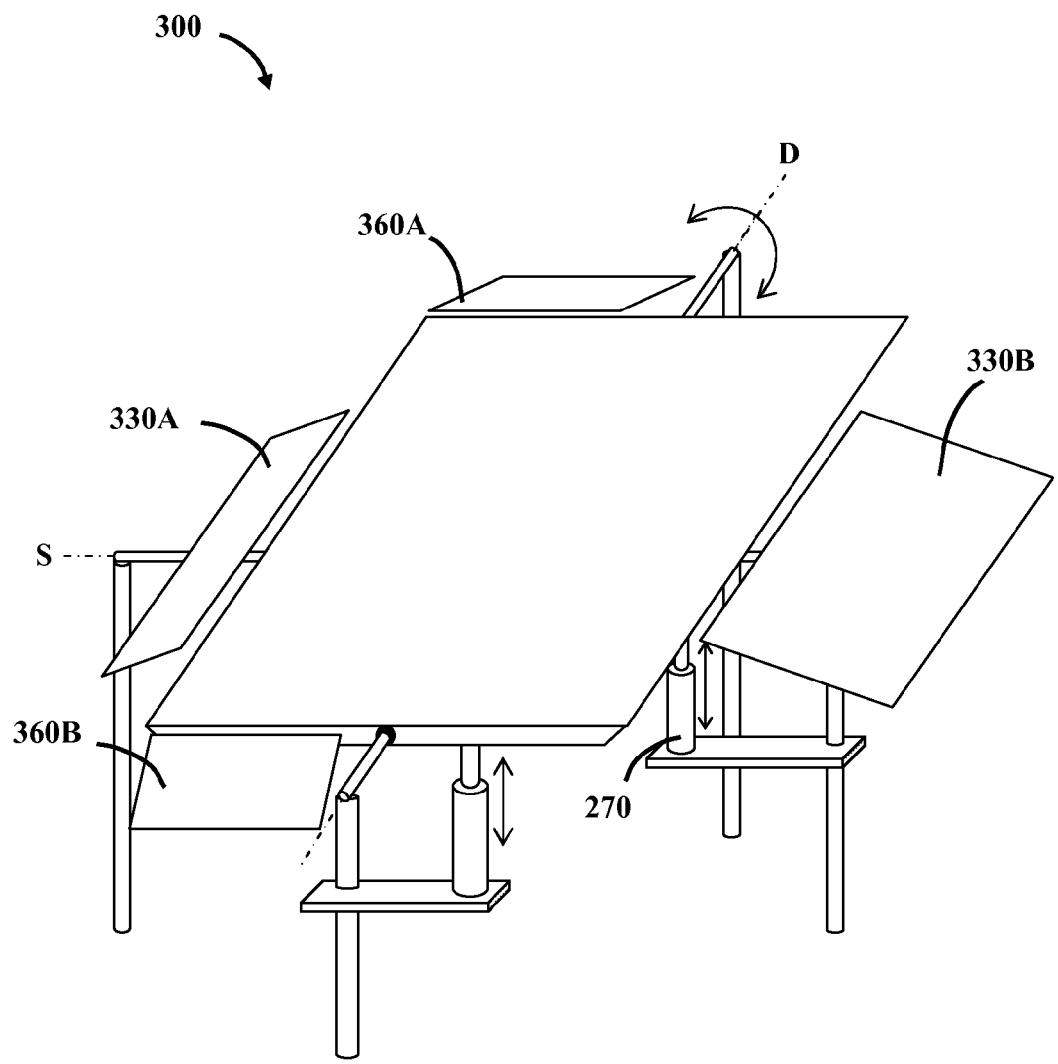
FIG. 3 schematically represents how side photovoltaic panels can be arranged facing outwards so that they do not shadow each other.

According to some embodiments, the side-mounted photovoltaic panels are configured to reduce shadowing of one over the other. This may be arranged in a variety of ways. Referring now to FIG. 3, a third embodiment of a self-powered light seeking apparatus 300 is shown. The third embodiment of a self-powered light seeking apparatus 300 includes a support platform 310, an axis 320, photovoltaic panels 330A, 330B, 360A, 360B and an actuator 340.

It is noted that in the third embodiment of the self-powered light seeking apparatus 300 the photovoltaic panels 330A, 330B, 360A, 360B are arranged facing outwards from the support platform 310 such that they do not shadow each other. As such, the apparatus 300 can be used throughout the daytime period without significant deterioration of its negative feedback due to mutual shadowing by the side photovoltaic panels.

Figure 4:
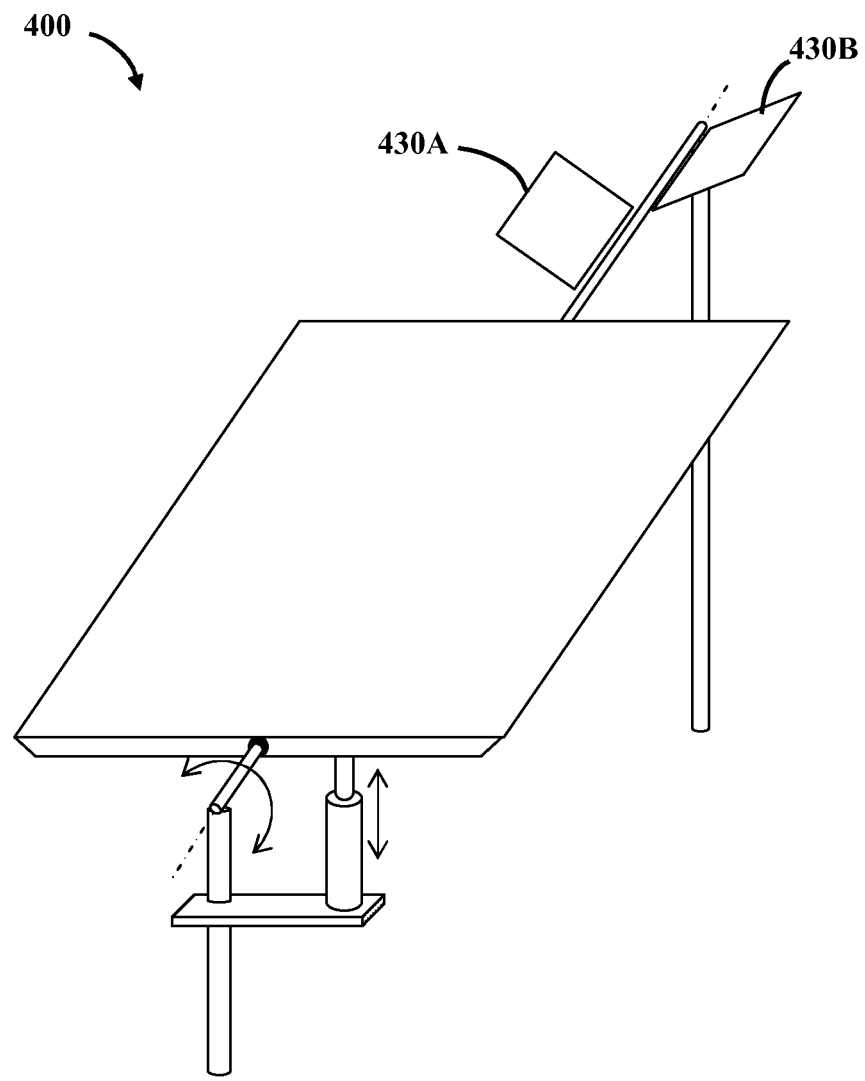
FIG. 4 schematically represents how side photovoltaic panels can be arranged facing inwards in a staggered fashion so that they do not shadow each other.

Referring now to FIG. 4, a fourth embodiment of a self-powered light seeking apparatus 400 is shown, in which the axis 420 holds a support platform 410 and also two photovoltaic panels 430A and 430B. It is noted that the photovoltaic panels may be arranged inwardly facing and set up in a staggered fashion, as exemplified by the photovoltaic panels 430A and 430B. In such an embodiment as well, the photovoltaic panels 430A and 430B will not shadow each other.

Furthermore, it will be appreciated that a self-powered solar tracking system will track the sun throughout the day until it is aligned towards the western horizon in the evening and remaining thus throughout the night. The configuration of the third or fourth embodiments allow the morning rays arriving from the east to be unobstructed such that they are incident upon the East facing solar panel 330B or 430B, thus allowing the actuator to realign the support platform 310 or 410, respectively, towards the morning sun as required.

Figure 5A:
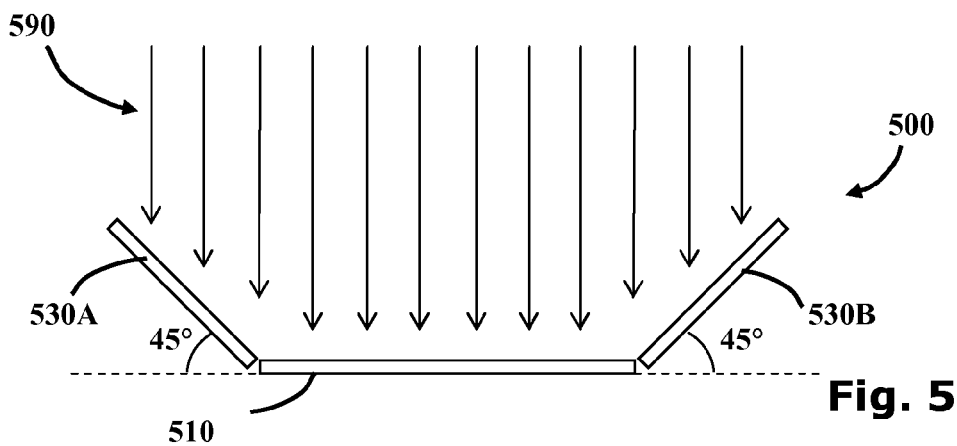
FIGS. 5A-C show schematic cross-sectional representations of a fifth embodiment of a self-powered light seeking apparatus in various orientation towards the light source.
Figure 5B:
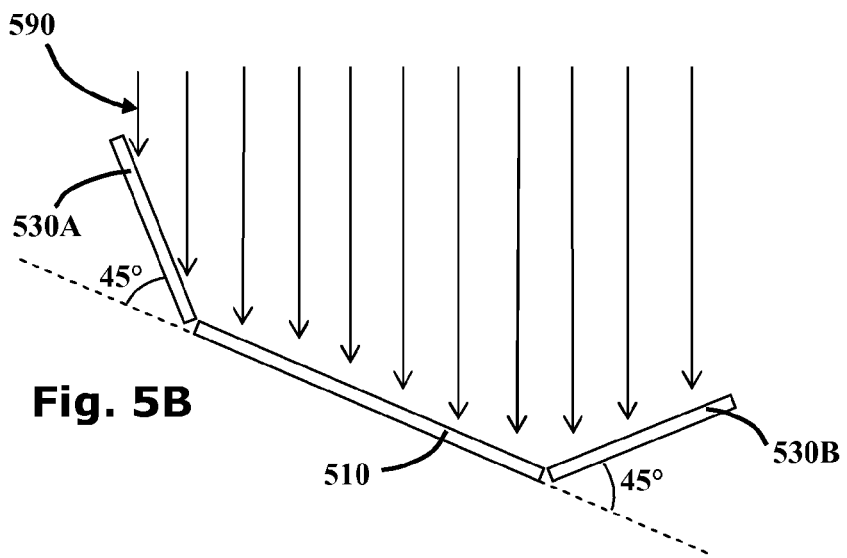
Figure 5C:
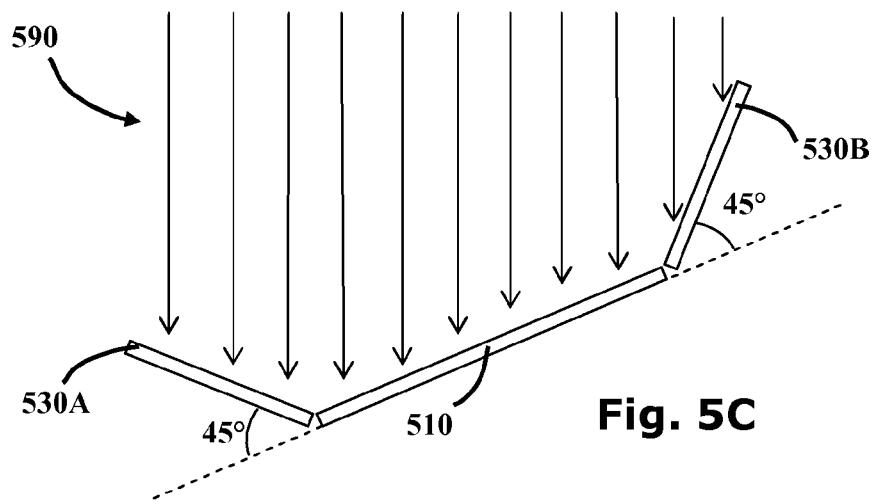

Reference is now made to FIGS. 5A-C showing schematic cross-sectional representations of a fifth embodiment of a self-powered light seeking apparatus 500 in various orientations towards the light source (not shown). The cross section of the apparatus 500 represents the support platform 510 and side photovoltaic panels 530A, 530B. Also shown in the schematic is a depiction of incident light 590.

With particular reference to FIG. 5A, it will be appreciated that when the support platform 510 is aligned to the light source, the light 590 impacting the first photovoltaic panel 530A and the second photovoltaic panel 530B will be of approximately the same intensity. This may be achieved, for example, by attaching the photovoltaic panels at opposing angles to the target plane. A starting value for calibration of such a system could be a forty-five degree angle to the target plane as shown in FIG. 5, although other angles may be used as suit requirements. The support platform 510 is parallel to the target plane such that when the support platform 510 is orthogonal to the incident light 590 from the light source (such as the Sun's rays for example), both photovoltaic panels 530A and 530B will be at forty-five degree angles to the light arriving from the light source. Where the panels 530A and 530B are arranged at similar opposing angles to the Sun, they receive similar intensity of sunlight. Accordingly both photovoltaic panels 530A and 530B will produce the same potential difference.

Referring now to FIG. 5B, the apparatus of FIG. 5A is shown tilted with respect to the incoming light 590 such that the second photovoltaic panel 530B receives a greater intensity of light that the first photovoltaic panel 530A. It will be appreciated that in such an orientation, the potential difference produced by the first photovoltaic panel 530A will be smaller than that produced by the second photovoltaic panel 530B. Similarly, referring now to FIG. 5C, the apparatus of FIG. 5A is shown tilted with respect to the incoming light 590 such that the first photovoltaic panel 530A receives a greater intensity of light that the second photovoltaic panel 530B. It will be appreciated that in such an orientation, the potential difference produced by the second photovoltaic panel 530B the first photovoltaic panel 530A will be smaller than that produced by the first photovoltaic panel 530A.

The size and polarity of the discrepancy of potential differences generated by each photovoltaic panel may be used to drive an actuator to realign the apparatus 500 as shown in FIG. 5A. Thus the orientation of the support platform may be maintained with respect to the incoming light.

Figure 6:
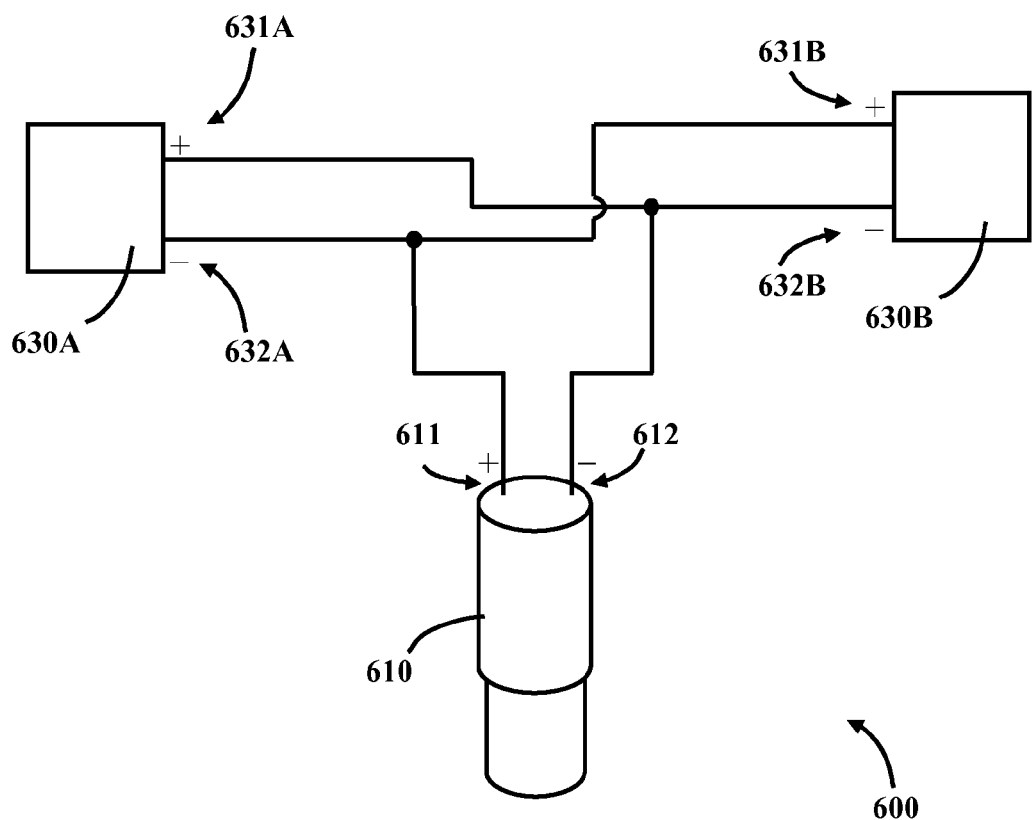
FIG. 6 is an illustration of the electrical connections from one set of opposing side photovoltaic panels to their associated electrical actuator.

Referring now to FIG. 6 showing a simple circuit diagram 600 of the conductive connections between an actuator 610 and two side photovoltaic panels 630A and 630B. Each of the panels 630A and 630B has an anode 631A and 631B, respectively, and a cathode 632A and 632B, respectively. The actuator 610 also has an anode 611 and a cathode 612.

The electrical connections from the side photovoltaic panels 630A and 630B would be connected in the fashion shown in FIG. 6. An electrical connection is made from the anode 631A of the first panel 630A and the cathode 632B of the opposing panel 630B to the cathode 612 of the actuator 610. Similarly an electrical connection is made from the cathode 632A of the first panel 630A and the anode 631B of the opposing panel 630B to the anode 611 of the actuator 610. When both photovoltaic panels 630A and 630B are receiving equal amounts of light energy, the potential difference produce by both will be the same, so the potential difference across the anode 611 and cathode 612 of the actuator 610 will be zero and the actuator 610 will not move. As the sun moves across the sky and the light energy incident on the opposing photovoltaic panels 630A and 630B changes, a potential difference will be produced across the terminals 611 and 612 of the actuator 610, causing the actuator 610 to operate, turning the target plane (and the attached photovoltaic panels 630A and 630B) more directly at the sun. Once the optimum angle is attained, the potential difference across the terminals 611 and 612 of the actuator 610 will once again be zero and the system will stop at equilibrium until a further detectable shift occurs in the sun's position.

Figure 7:
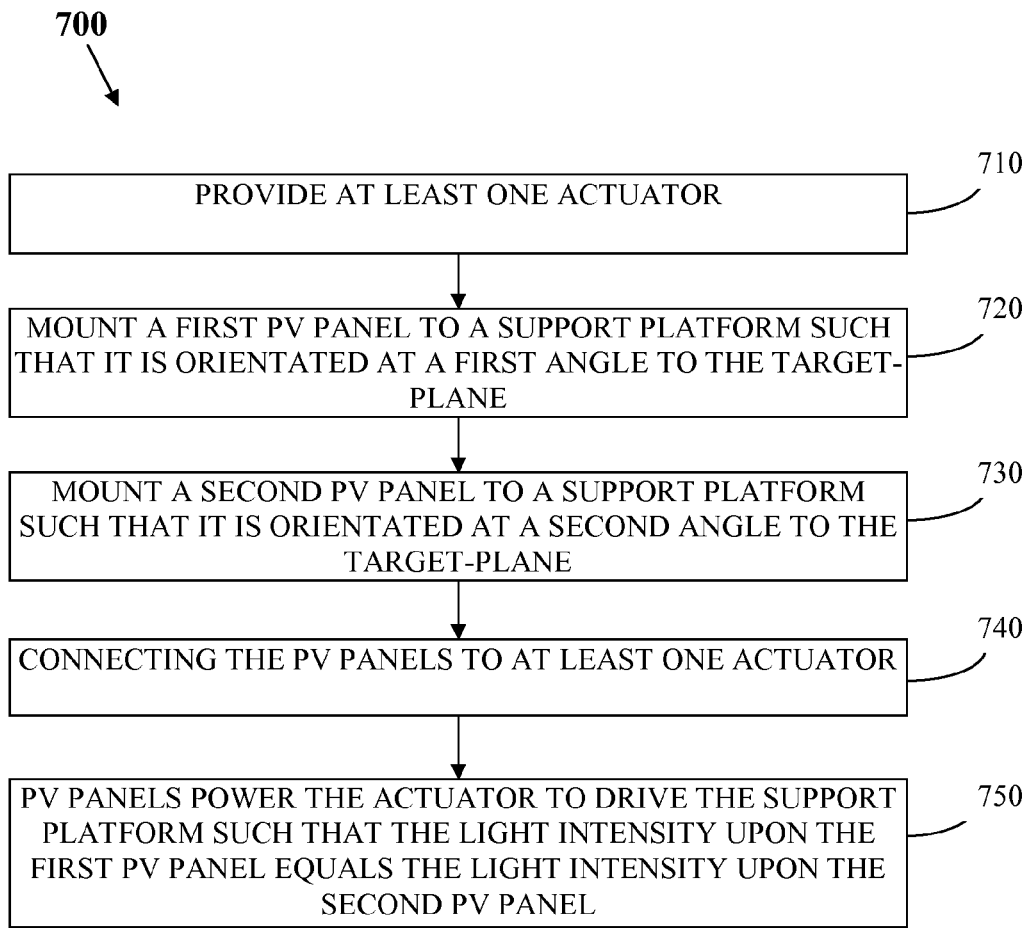
FIG. 7 is a flowchart representing a method for aligning a target-plane towards a light source.

Referring now to the flowchart of FIG. 7, a method 700 for aligning a target-plane towards a light source is presented. The method involves: providing at least one actuator 710, mounting a first photovoltaic panel to a support platform such that it is orientated at a first angle to the target-plane 720, mounting a second photovoltaic panel to the support platform that it is orientated at a second angle to the target-plane 730, connecting the photovoltaic panels to at least one actuator 740, and the photovoltaic panels powering at least one actuator to drive the support platform such that light intensity upon the first photovoltaic panel equals light intensity upon the second photovoltaic panel 750.

Solar Concentration System

Figure 8:
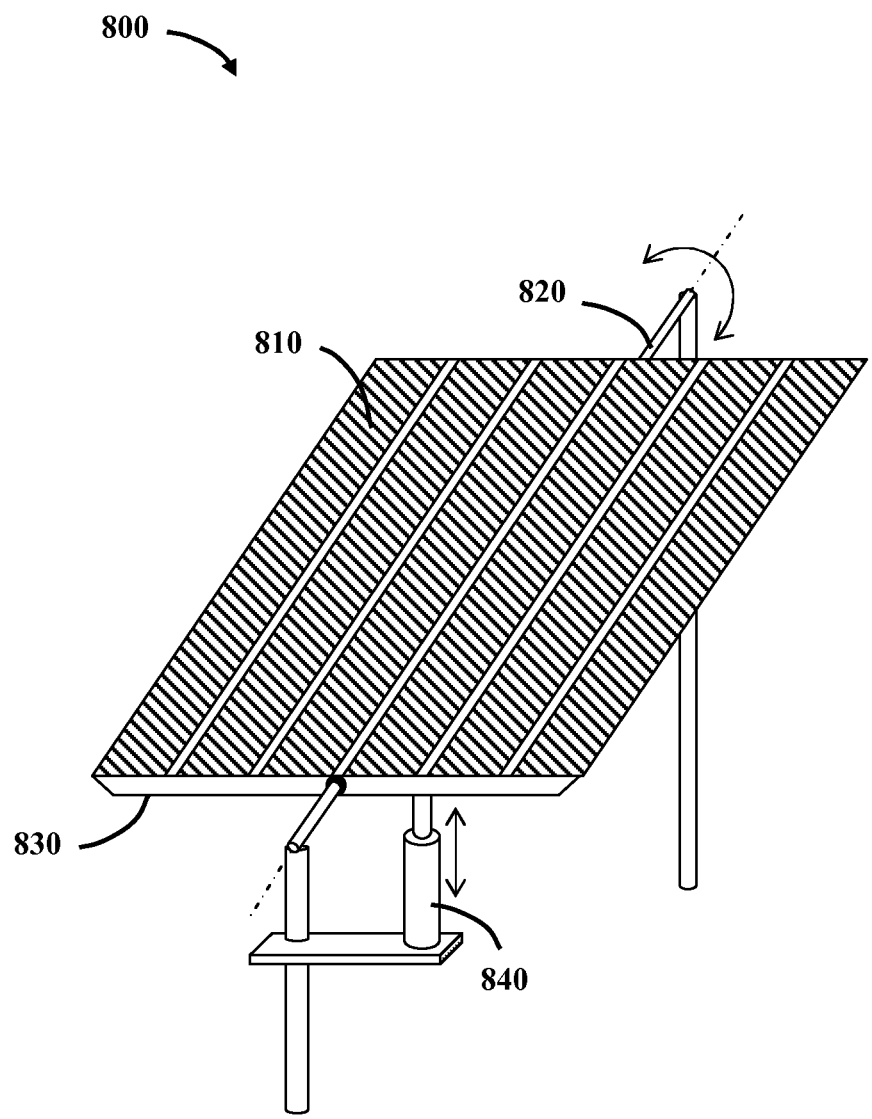
FIG. 8 is a schematic representation of a planar photovoltaic solar with a set of photovoltaic cells mounted on a platform on an axis with an actuator which is able to apply torque to rotate the platform about that axis.

Reference is now made to FIG. 8, which shows a schematic of a photovoltaic solar collection apparatus 800 configured an operable to track the sun. The photovoltaic solar collection apparatus 800 includes a platform 830 covered with photovoltaic cells 810 supported on an axis 820 and coupled to an actuator 870. The actuator 840 is configured to mechanically generate torque to rotate the platform 830 about the axis 820.

In such an apparatus, it will be appreciated that the greatest intensity of solar energy will impinge on the photovoltaic cells when the platform 830 is aligned normal to the direction of the sun's radiation. It will further be appreciated that in such an embodiment, the only way to collect more energy would be to increase the active area of the platform 830, i.e., the area covered with photovoltaic cells 810, thereby increasing the number of cells.

It is noted that increasing the number of cells may significantly increase the cost of the collection apparatus. Furthermore, adding more photovoltaic cells may make the apparatus heavier and subject to large wind forces thereby increasing operating costs and wear and tear on the actuator 840.

Figure 9A:
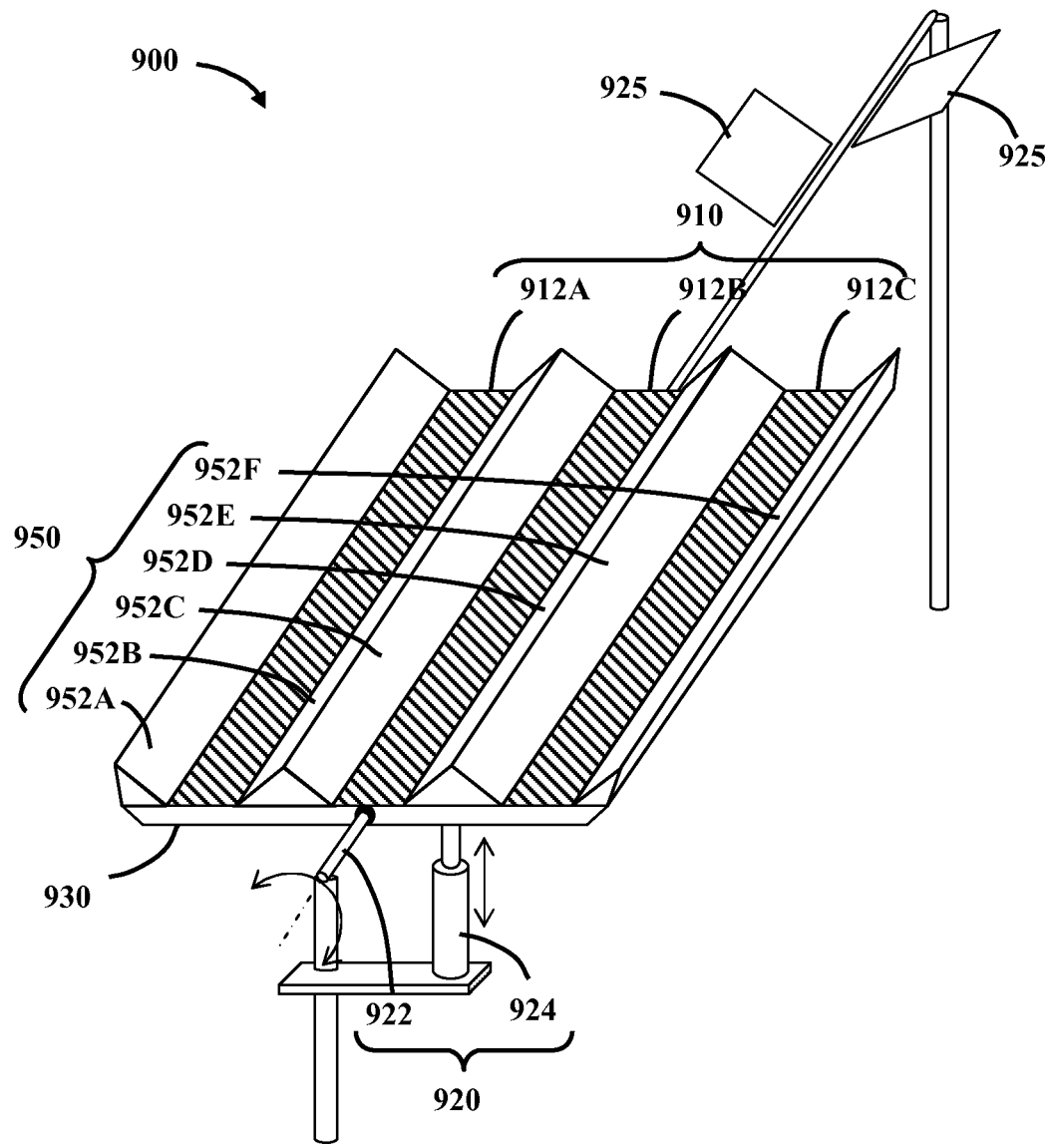
FIG. 9A is a schematic representation of an embodiment of a planar solar concentration system using angled planar mirrors orientated North-South to concentrate solar energy onto a number of strips of photovoltaic cells.

Referring now to FIG. 9A a first embodiment of a solar concentration system 900 is represented. The first embodiment might include a platform 930 supporting a light concentrator 950 and a photoelectric assembly 910.

The platform 930 may be coupled to a tracking mechanism 920, for example by being mounted upon an axis 922 and coupled to an actuator 924 such that the actuator 924 can mechanically generate torque to rotate the platform 930 about the axis 922.

It is noted that in contradistinction to other systems 800 such as described hereinabove in relation to FIG. 8, the photovoltaic assembly 910 has an active area 912 that only partially covers the platform 930 with photovoltaic cells which are arranged into strips, e.g., 912A-C.

The light concentrator 950 includes a system of reflectors 952A-F covering the remaining area of the platform 930. The reflectors 952A-F are planar and are configured to subtend at an angle to the plane of the active area 912 such that light arriving at an angle normal to the plane and striking the reflector 950 may be reflected onto the photovoltaic cell strip.

It will be appreciated that the incident radiation upon the platform either strikes the photovoltaic cell strips 912A-C directly or else is directed from reflectors 952A-F toward the photovoltaic cell strips 912A-C. Consequently, the amount of radiation striking the photovoltaic strips 912A-C will be approximately the same as the amount of radiation, which unimpeded, would have struck the area of the platform 930 as a whole. Accordingly, using the solar concentration system described herein, the same amount of solar radiation may be collected with fewer of photovoltaic cells being used.

The solar concentration system 900 may further comprise a tracking mechanism 920 operable to orientate the platform 930 towards the sun during its apparent daily movement across the sky such that the photovoltaic cell strips 912A-C are aligned normal to the direction of the sun's radiation and the reflectors 952A-F of the light concentrator 950 maintain a functional alignment and do not shade the active area. In addition, a seasonal tracking mechanism may be employed to orientate the platform 930 by changing its elevation such that it points towards the sun during its apparent seasonal movement above and below the equator. See Alignment Systems, above, for a detailed discussion of tracking systems that may be employed in the solar concentration system 900. For example, the axis 922 may hold two photovoltaic panels 925 that control and power the actuator 924. See the discussion above regarding the self-powered light seeking apparatus 400 for further discussion of a possible a tracking system for use with such a system. Alternatively, other tracking systems, for example as discussed above regarding self-powered light seeking apparatus 100, 200 or 300, may be used. Still other tracking systems may be used as known in the art.

Figure 9B:
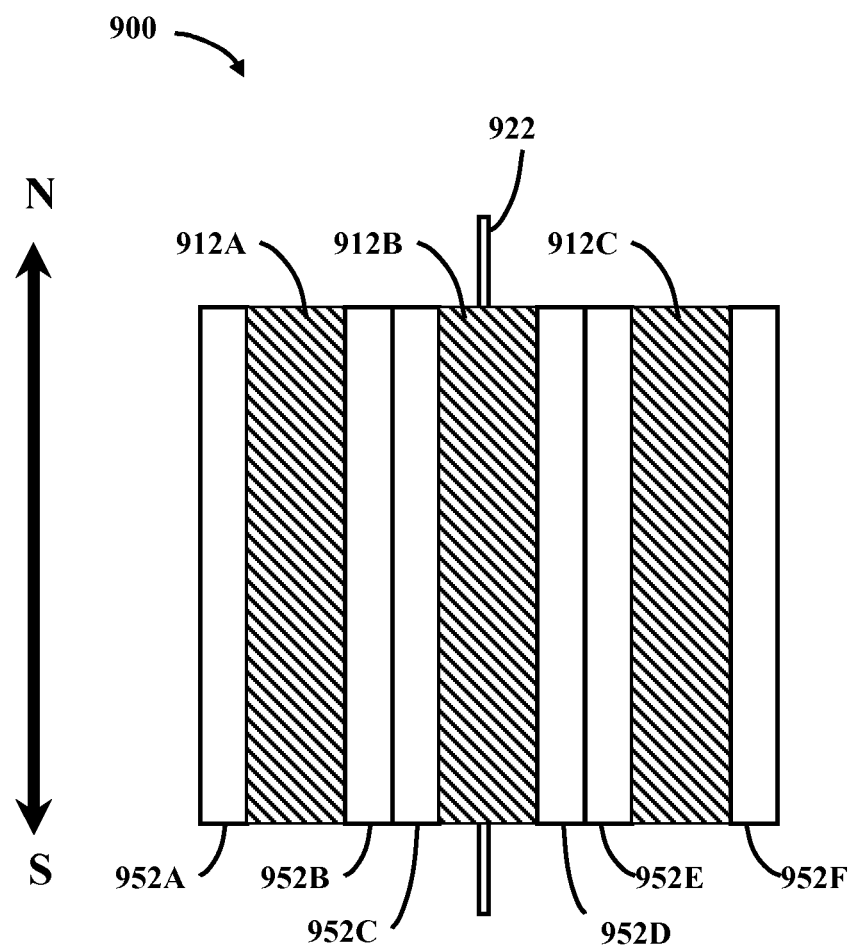
FIG. 9B is a top view of the planar solar concentration system illustrating the angled planar mirrors and the strips of photovoltaic cells arranged in an orientation parallel to the North-South axis.

Making reference to FIG. 9B, the photovoltaic strips 912A-C and the reflectors 952A-F may be arranged in an orientation parallel to the North-South axis over the platform 930.

Figure 9C:
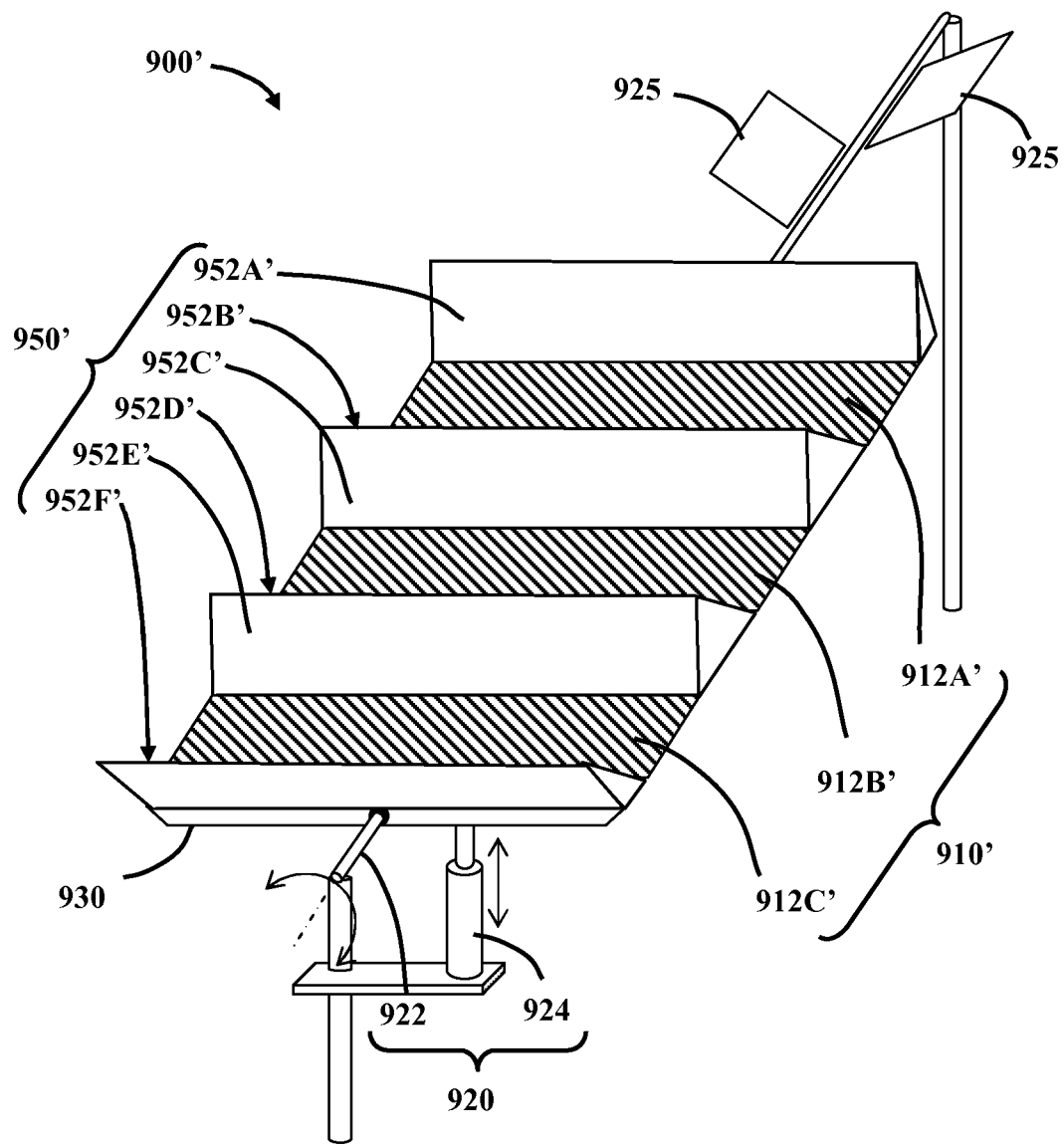
FIG. 9C is a schematic representation of another embodiment of a planar solar concentration system using angled planar mirrors orientated East-West to concentrate solar energy onto a number of strips of photovoltaic cells.
Figure 9D:
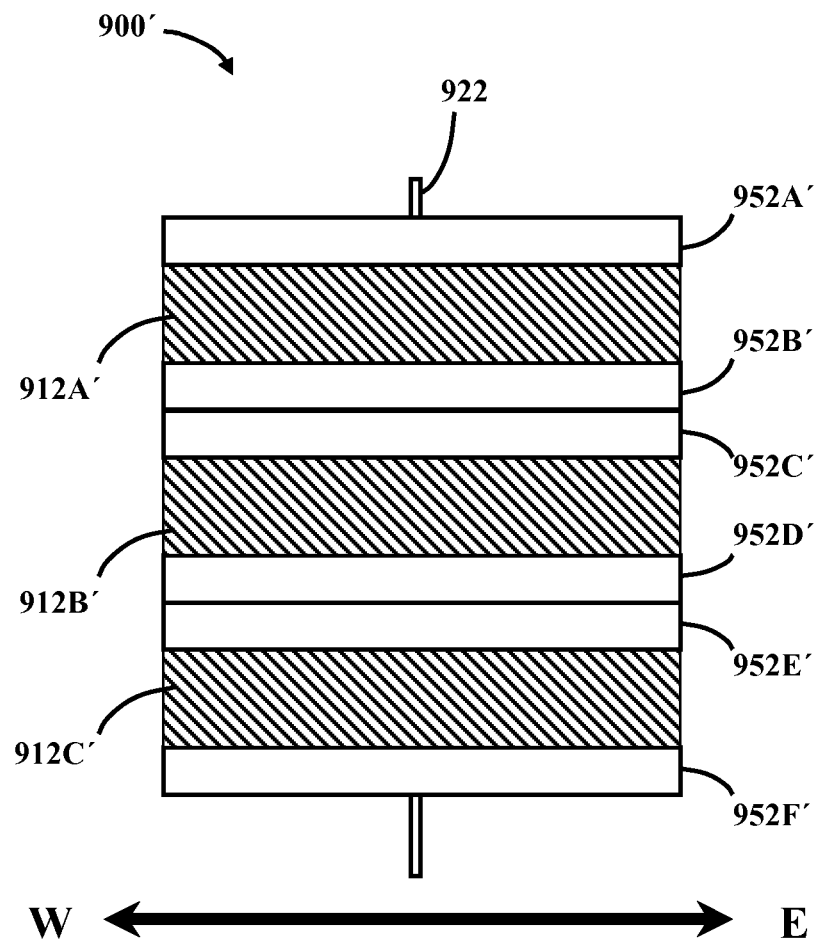
FIG. 9D is top view of the planar solar concentration system illustrating the angled planar mirrors and the strips of photovoltaic cells be arranged in an orientation parallel to the East-West axis.

Alternatively, making reference to FIG. 9C, another embodiment of a planar solar concentration system 900'. The system 900' may use an East-West oriented light concentrator 950' and photovoltaic assembly 910'. Accordingly, East-West oriented angled planar mirrors 952A'-F' to concentrate solar energy onto a number of East-West oriented strips 912A'-F' of photovoltaic cells. It has been found that using an East-West orientation for the light concentrator 950' and photovoltaic assembly 910', may significantly reduce shadowing of the photovoltaic cells by the mirrors throughout the day.

It will be appreciated that in many areas of the world where photovoltaic current generation may be theoretically practical, the costs of importing expensive photovoltaic cells to use in new units or to use as replacements may be prohibitive. The concentrating arrangements 900' described above in relation to FIG. 9A-D may reduce the amount of photovoltaic cells needed to extract the same amount of energy from the same solar energy-collecting field. In this way the solar collection apparatus can become more cost effective to run. Moreover, the reflectors 952A-F, 952A-F' of the light concentrator 950, 950' need not be fashioned into curved shapes, thus allowing simpler planar reflectors to be used, which are cheaper to manufacture and easier to assemble.

For example, the platform 930 may comprise a lightweight fiberglass mold upon which the photoelectric assembly 910. 910' and light concentrator 950, 950' may be mounted. Where appropriate, reflective paint may be used to coat an angled mold to form reflectors 952A-F, 952A-F'.

Figure 10A:
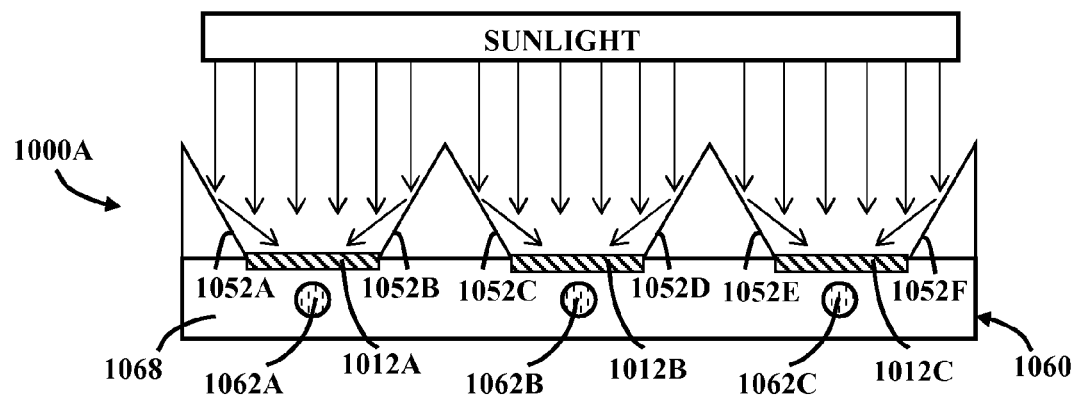
FIG. 10A is a schematic diagram of a cross-section of a planar solar concentration system showing the planar reflecting surfaces directing light towards the photovoltaic panels.

Referring now to FIG. 10A, a first cross-section 1000A is presented of an embodiment of a planar solar concentration system. This cross-section shows the photovoltaic cell strips 1012A-C, the reflectors 1052A-F and a cooling unit 1060. Also shown is a depiction of solar radiation 1040 striking the reflectors 1052A-F and being redirected towards the photovoltaic cell strips 1012A-C.

It is noted that in the embodiment of the planar solar concentration system 1000 shown in FIG. 10A, the area occupied by the reflectors 1052A-F is the same as the area occupied by the photovoltaic cell strips 1012A-C. Further, the reflectors 1052A-F have the same width as the width of the photovoltaic cell strips 1012A-C and subtend at an angle of 60 degrees from the plane of the active area. It will be appreciated that in such a configuration, the photovoltaic cell strips 1012A-C, in aggregate, will cover half of the total light catchment area. It will be further be appreciated that in such a configuration, when the photovoltaic cell strips 1012A-C are aligned normal to the direction of the sun's radiation, the sun's radiation reflected by the reflectors 1052A-F are directed to precisely cover the area of the photovoltaic cell strips 1012A-C, thus reducing or eliminating unevenness in the concentration of the solar radiation that the photovoltaic cell strips 1012A-C receives and solar radiation being reflected away from the system 1000 before striking one of the photovoltaic cell strips 1012A-C. As a consequence, the planar solar concentration system 1000 enables the concentration of solar radiation striking the photovoltaic cell strips 1012A-C by a factor of 2. It has been found that a concentration factor of between 1.5 and 3 may increase the electrical output of photovoltaic cells without overheating the system to reduce efficiency.

In a system making use of concentrated solar energy, it will be appreciated that the areas where the solar energy is concentrated experience increased heating, both from solar infra-red energy and from inefficient conversion of impacting photons to electrical current in the photovoltaic cell strips 1012A-C. It will further be appreciated that such increased heating can cause a deterioration of the conversion efficiency of such photovoltaic cell strips 1012A-C and may also pose a threat of permanent degradation to the photovoltaic cell strips 1012A-C. The cooling unit 1060 provides a heat-exchange system capable of maintaining the photovoltaic material at an efficient operational temperature.

The cooling unit 1060 comprises a plurality of pipes 1062A-C in thermal contact with the photovoltaic strips 1012A-C. Placing the pipes 1062A-C beneath the photovoltaic cell strips 1012A-C allows a stream of coolant to circulate and cool the photovoltaic cell strips 1012A-C to an efficient operating temperature.

It is further noted that the cooling unit 1060 may further include a heat trap 1068 in which the heat exchange pipes 1062A-C are enclosed. Such a heat trap 1068 may create a greenhouse effect or otherwise prevent heat losses to the environment thus increasing the amount of heat being transferred to the pipes 1062A-C.

Figure 10B:
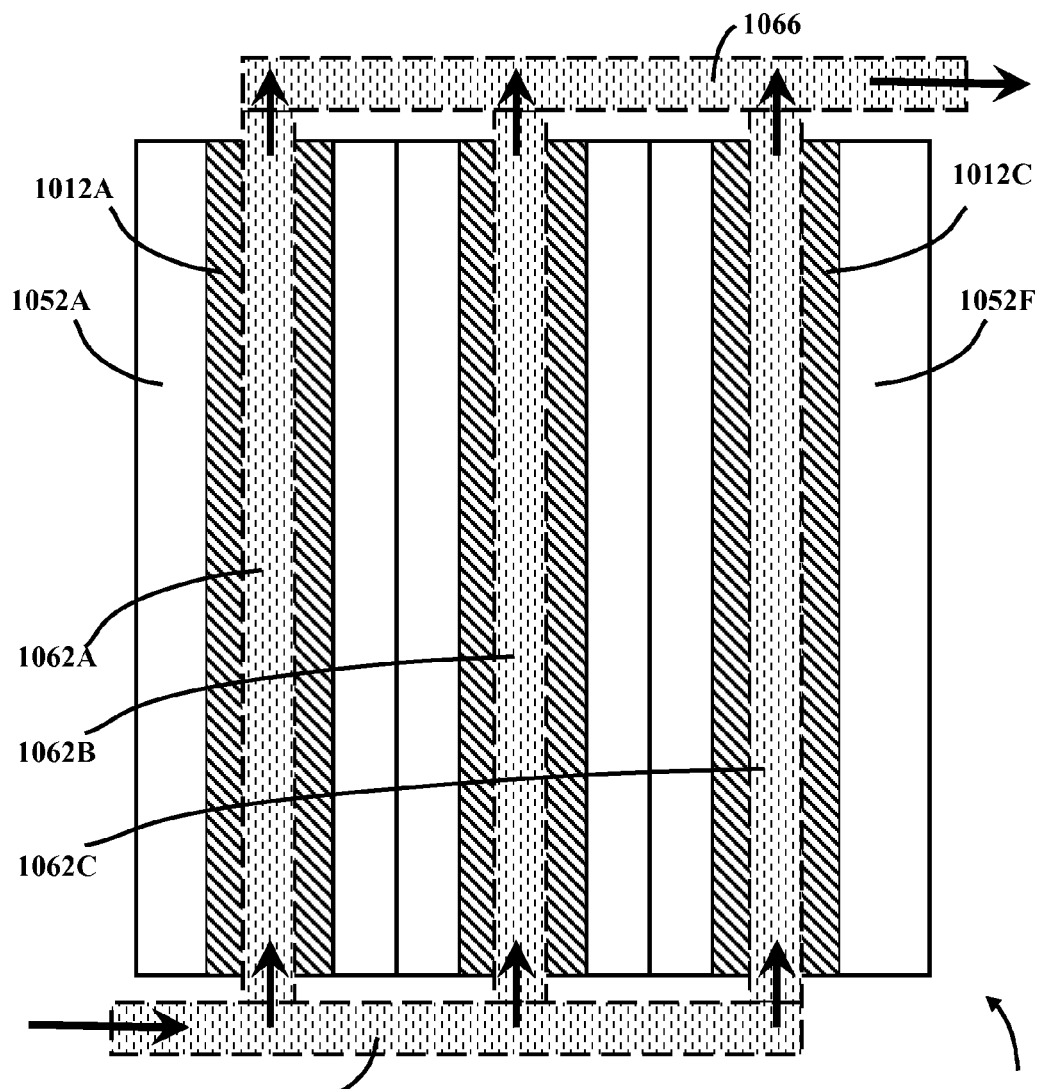
FIG. 10B is a schematic diagram of a second cross-section of the planar solar concentration system of FIG. 10A, showing a possible cooling system behind the photovoltaic panels.

Referring now to FIG. 10B another cross-section 1000B is presented of the embodiment of a planar solar concentration system. The cooling unit 1060 includes coolant pipes 1062A-C in fluid communication with feeder lines 1064, 1066. A coolant, such as water or the like, may be drawn into the inlet feeder line 1064, through the coolant pipes 1062A-C in thermal contact with the photovoltaic strips 1012A-C, and into the outlet feeder line 1066.

The feeder lines 1064, 1066 may be connected to a domestic water heater, air conditioning unit, desalination plant or other such system whereby the heated coolant may be utilized.

It will be appreciated that due to the inefficiency of known photovoltaic conversions and because of the inherent presence of infrared light in the solar spectrum, any solar panel, even one configured to use visible or ultraviolet light, will experience heating. It is a particular advantage of the embodiments described above in relation to FIGS. 10A and 10B that this heat energy, which would otherwise be wasted, may be used. A heat exchange mechanism may be utilized both as a cooling system for the photovoltaic apparatus and as a thermal power generator.

The use of such a heat exchange mechanism increases the overall energy efficiency of the solar collection apparatus by a large factor, perhaps enough to change a non-economic solar collection system into an efficient solar collection system.

It is further noted that where an arrangement such as described in relation to FIGS. 10A and 10B, is mounted upon a tracking mechanism, at least one heat exchange pipe 1062 may further serve as an axis of rotation. For example the arrangement may be rotatably coupled to a central North-South aligned pipe 1062B such that it may rotate to align to the sun during its apparent daily motion across the sky.

Figure 11:
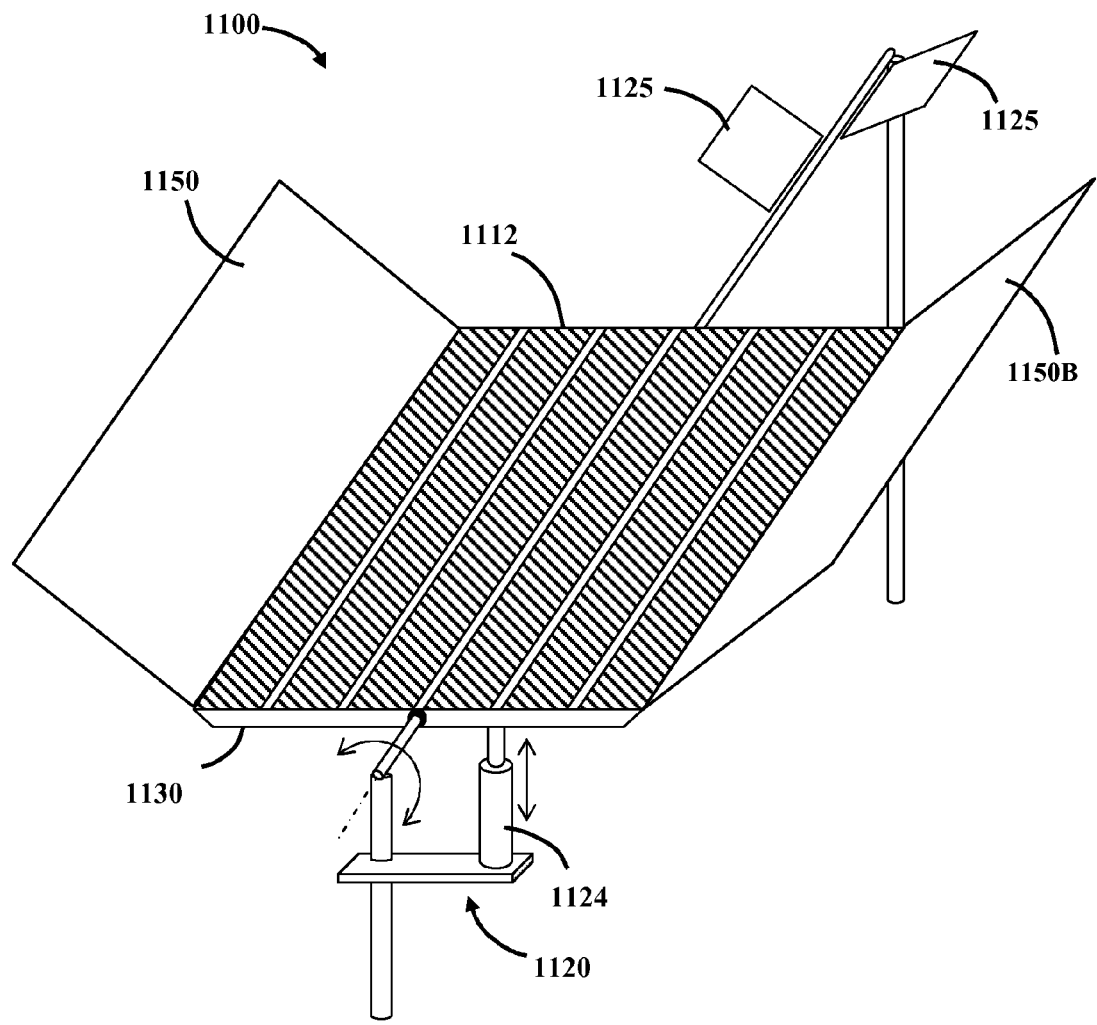
FIG. 11 is a schematic representation of another embodiment that has a wider photovoltaic collecting area bracketed by larger planar reflectors for concentration of solar energy.

According to various embodiments, systems may utilize a single active area or a plurality of active areas such as strips. Referring now to FIG. 11, showing a fourth embodiment of a solar concentration system 1100, the solar concentration system 1100 of the fourth embodiment has a single larger active area 1112 and two wing reflectors 1150A, 1150B flanking the active area 1112. The reflectors 450A, 450B are supported by wings mounted to the support platform 1130 and may redirect impacting light towards the active area 1112. In this way, the system may be retrofitted to existing solar collectors to redirect incoming solar radiation over a much larger apparent area to the same collecting photovoltaic panels. It is noted that the active area 1112 is supported by a platform 1130 coupled to a tracking mechanism 1120 to prevent the wings shading the active area. The platform 1130 may aligned to the sun by means of an actuator 1124. See Alignment Systems, above, for a detailed discussion of tracking systems that may be employed in the solar concentration system 1100. For example, the axis 1122 may hold two photovoltaic panels 1125 that control and power the actuator 1124. See the discussion above regarding the self-powered light seeking apparatus 400 for further discussion of such a tracking system. Additionally or alternatively, other tracking systems, such as discussed above regarding self-powered light seeking apparatus 100, 200 or 300, may be used.

The scope of the disclosed subject matter is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A self-powered light seeking apparatus comprising:
   at least one linear actuator piston having a positive anode input and a negative cathode input, said linear actuator piston configured to direct a target-plane towards a light source by driving said target-plane in a first direction when a positive potential difference is applied between the positive anode input and the negative cathode input and by driving said target-plane in a second direction when a negative potential difference is applied between the positive anode input and the negative cathode input;
   at least one photovoltaic powering arrangement comprising a first photovoltaic panel configured at a first angle to the target-plane and comprising at least one photovoltaic cell connected to a first anode output and a first cathode output such that the magnitude of potential difference between the first anode output and the first cathode output is dependent upon angle of light incident upon said first photovoltaic panel; and
   a second photovoltaic panel configured at a second angle to the target-plane and comprising at least one photovoltaic cell connected to a second anode output and a second cathode output such that the magnitude of potential difference between the second anode output and the second cathode output is dependent upon angle of light incident upon said second photovoltaic panel, wherein
      the first anode output of said first photovoltaic panel and the second cathode output of said second photovoltaic panel are connected directly to the positive anode input of said linear actuator piston, and
      the first cathode output of said first photovoltaic panel and the second anode output of said second photovoltaic panel are connected directly to the negative cathode input of said linear actuator piston, the cathode of said first photovoltaic panel and the anode of said second photovoltaic panel are connected to the cathode of said actuator,
   such that said photovoltaic powering arrangement is configured to convert light energy into a driving current such that said linear actuator piston drives the target-plane towards alignment with the light source.

2. The apparatus of claim 1 wherein the first angle is equal and opposite to the second angle.

3. The apparatus of claim 1 wherein the first angle is approximately equal to forty-five degrees to the target-plane and the first angle is approximately equal to minus forty-five degrees to the target-plane.

4. The apparatus of claim 1 wherein said first photovoltaic panel and said second photovoltaic panel are configured such that they do not shade one another.

5. The apparatus of claim 1 wherein said photovoltaic powering arrangement further comprises:
   a third photovoltaic panel configured at a third angle to the target-plane and comprising at least one photovoltaic cell connected to an anode and a cathode such that the magnitude of potential difference between its anode and its cathode is dependent upon angle of light incident upon said photovoltaic panel; and
   a fourth photovoltaic panel configured at a fourth angle to the target-plane and comprising at least one photovoltaic cell connected to an anode and a cathode such that the magnitude of potential difference between its anode and its cathode is dependent upon angle of light incident upon said photovoltaic panel.

6. The apparatus of claim 5 wherein the anode of said third photovoltaic panel and the cathode of said fourth photovoltaic panel are connected to an anode of at least a second actuator, and the cathode of said third photovoltaic panel and the anode of said fourth photovoltaic panel are connected to the cathode of said second actuator.

7. The apparatus of claim 1 comprising a first actuator configured to rotate said target plane about a first axis and connected to a first photovoltaic power arrangement.

8. The apparatus of claim 7 further comprising a second actuator configured to rotate said target plane about a second axis and connected to a second photovoltaic power arrangement.

9. The apparatus of claim 7 wherein said first actuator comprises an azimuth actuator configured to drive said target-plane about a polar axis.

10. The apparatus of claim 8 wherein said second actuator comprises an elevation actuator configured to drive said target-plane about a declination axis.

11. The apparatus of claim 1 wherein said apparatus comprises a solar panel mounted to a framework and configured to track the daily and seasonal movement of the sun across the sky.

12. The apparatus of claim 1 wherein said apparatus comprises an altazimuth support platform.

13. The apparatus of claim 1 wherein said apparatus comprises a telescope.

* * * * *